(12) United States Patent
Daugherty et al.

(10) Patent No.: US 10,715,231 B1
(45) Date of Patent: Jul. 14, 2020

(54) ANTENNA SWITCH DIVERSITY CIRCUITRY

(71) Applicant: Google LLC, Mountain View, CA (US)

(72) Inventors: John Daugherty, Waukegan, IL (US);
Vimalkaushik Natarajan, Palatine, IL (US)

(73) Assignee: Google LLC, Mountain View, CA (US)

( * ) Notice: Subject to any disclaimer, the term of this patent is extended or adjusted under 35 U.S.C. 154(b) by 34 days.

(21) Appl. No.: 16/255,910

(22) Filed: Jan. 24, 2019

(51) Int. Cl.
*H01Q 1/00* (2006.01)
*H01Q 21/00* (2006.01)
(Continued)

(52) U.S. Cl.
CPC ......... *H04B 7/0602* (2013.01); *H03K 17/693* (2013.01); *H04B 1/48* (2013.01); *H04B 7/12* (2013.01); *H04L 5/1461* (2013.01)

(58) Field of Classification Search
CPC ........ H01Q 3/44; H01Q 21/28; H01Q 5/0006; H01Q 5/0072; H01Q 21/24; H01Q 21/30; H01Q 7/00; H01Q 21/29; H01Q 9/16; H01Q 1/244; H01Q 1/38; H01Q 5/0003; H01Q 1/243; H01Q 1/242; H01Q 1/084; H01Q 1/246; B65D 65/403; B65D 2203/10; G06K 19/07749; H01L 35/00; H04B 1/48; H04B 1/44; H04B 1/525; H04B 1/406; H04B 1/18; H04B 1/3833; H04B 7/0617; H04B 7/0408; H04B 1/005; H04B 1/0057;
(Continued)

(56) References Cited

U.S. PATENT DOCUMENTS 9,236,930 B2 1/2016 Larsen
9,961,600 B2 5/2018 Gopal et al.
(Continued)

FOREIGN PATENT DOCUMENTS

CN 105305101 A 2/2016
CN 106876881 A 6/2017
(Continued)

OTHER PUBLICATIONS

International Search Report and Written Opinion of International Application No. PCT/US2019/063787, dated Feb. 7, 2, 2020, 12 pp.
(Continued)

*Primary Examiner* — Minh D A
(74) *Attorney, Agent, or Firm* — Shumaker & Sieffert, P.A.

(57) ABSTRACT

Antenna switch diversity circuitry can include four switches. A first switch can be connectable to a first transmitter, a first receiver, and a second receiver. A second switch can be connectable to a second transmitter, a third receiver, and a fourth receiver. A third switch can be directly connected to the first switch, the second switch, a first antenna, and a second antenna. A fourth switch directly can be connected to the first switch, the second switch, a third antenna, and a fourth antenna. The first and second switches can be configured to be controlled by a control signal in a manner so as to prevent a signal from the first transmitter and a signal from the second transmitter from being conveyed through a same switch, which can reduce a production of an intermodulation distortion signal by the signal from the first transmitter and the signal from the second transmitter.

21 Claims, 11 Drawing Sheets

(51) Int. Cl.
*H04M 1/00* (2006.01)
*H04B 7/06* (2006.01)
*H04B 7/12* (2006.01)
*H03K 17/693* (2006.01)
*H04L 5/14* (2006.01)
*H04B 1/48* (2006.01)

(58) Field of Classification Search
CPC ..... H04W 16/28; H04W 16/24; H04W 88/06; H04W 88/02
See application file for complete search history.

(56) References Cited

U.S. PATENT DOCUMENTS

| | | | |
|---|---|---|---|
| 2001/0005685 A1* | 6/2001 | Nishimori | H01Q 3/267 455/562.1 |
| 2005/0277387 A1* | 12/2005 | Kojima | H04B 7/04 455/78 |
| 2009/0262672 A1* | 10/2009 | Sin | H04B 1/0064 370/297 |
| 2014/0169243 A1 | 6/2014 | Khlat et al. | |
| 2016/0134016 A1 | 5/2016 | Hsu et al. | |
| 2017/0054470 A1 | 2/2017 | Reza et al. | |
| 2017/0187431 A1 | 6/2017 | Zhu | |
| 2017/0294951 A1 | 10/2017 | Weissman et al. | |
| 2017/0353955 A1 | 12/2017 | Hsu et al. | |
| 2018/0054470 A1 | 2/2018 | Chen | |
| 2018/0131501 A1 | 5/2018 | Little | |
| 2018/0204101 A1 | 7/2018 | De Jongh et al. | |

FOREIGN PATENT DOCUMENTS

| | | |
|---|---|---|
| CN | 107275780 A | 10/2017 |
| CN | 107294545 A | 10/2017 |
| CN | 107645596 A | 1/2018 |
| EP | 2720378 A1 | 4/2014 |
| WO | 2017084343 A1 | 5/2017 |
| WO | 2017113693 A1 | 7/2017 |
| WO | 2017219516 A1 | 12/2017 |

OTHER PUBLICATIONS

"5G: What is Stadalone (SA) vs Non-Standalone (NSA) Networks?" Mediatek, Mar. 7, 2018, https://www.mediatek.com/blog/5g-what-is-standalone-sa-vs-non-standalone-nsa (printed Jan. 9, 2019), 2 pages.
"Desense", http://www.antenna-theory.com/definitions/desense.php (printed Jan. 12, 2019), 3 pages.
Li et al., "Flipping the CMOS Switch", IEEE microwave magazine, 1527-3342/10/$26.00/2010 IEEE, Feb. 2010, pp. 86-96, 11 pages.
"Analog Switches and Multiplexers Basics", Analog Devices, MT-088, Tutorial, Rev.0, Oct. 2008, WK, 23 pp.
Kazim, "Design of Highly Linear Sampling Switches for CMOS Track-and-Hold Circuits", Division of Electronics Systems, Department of Electrical Engineering, Linkopings universitet, Linkoping, Sweden, Electronic Publishing Date Apr. 25, 2006, http://um.kb.se/resolve?urn=urn:nbn:se:liu:diva-6339, 69 pages.
Wikipedia, "Multiway Switching", https://en.wikipedia.org/wiki/Multiway_switching, printed Jan. 16, 2019, 6 pages.
Wikipedia, "Antenna Diversity", https://en.wikipedia.org/wiki/Antenna_diversity, printed Jan. 9, 2019, 4 pages.
Wikipedia, "Diversity Scheme", https://en.wikipedia.org/wiki/Diversity_scheme, printed Jan. 17, 2019, 3 pages.
Hall, "Understanding Intermodulation Distortion Measurements", ElectronicDesign, Oct. 9, 2013, https://www.electronicdesign.com/communications/understanding-intermodulation-distortion-measurements, printed Jan. 12, 2019, 9 pages.

\* cited by examiner

ANTENNA SWITCH DIVERSITY CIRCUITRY

BACKGROUND

A diversity scheme can be a technique used to improve a reliability of a communication of a signal propagated through space as a radio wave. Such a signal can be susceptible to fading, co-channel interference, or both. The diversity scheme can provide for multiple versions of the signal to be communicated through multiple channels. So, for example, if one version of the signal is communicated through a channel that experiences a high degree of fading, but another version of the signal is communicated through a channel that does not experience a high degree of fading, then a combination of the multiple versions of the signal by a receiver can improve the reliability of the communication of the signal.

The diversity scheme can include, for example, multiple antennas to transmit and/or receive the multiple versions of the signal. Such a diversity scheme can be referred to as antenna diversity. Antenna diversity can include techniques with respect to types and arrangements of the multiple antennas and techniques with respect to processing the multiple versions of the signal. For example, the multiple antennas can be arranged so that one antenna is physically separated from another antenna. Such a technique can be referred to as spatial diversity. Spatial diversity is common in broadband cellular network technology. In broadband cellular network technology, antennas can be disposed on base stations, which can be miles apart to produce multiple signal paths for the multiple versions of the signal. Moreover, in broadband cellular network technology, antennas can be disposed at separate locations on a mobile communications device so that it is unlikely that a hand holding the mobile communications device will block all of the antennas on the mobile communications device. Additionally, for example, the mobile communications device can include an algorithm to switch from a first antenna to a second antenna in response to a measurable condition. Such a technique can be referred to as antenna switch diversity.

BRIEF SUMMARY

According to an implementation of the disclosed technologies, antenna switch diversity circuitry can include four switches. A first switch can be connectable to a first transmitter, a first receiver, and a second receiver. A second switch can be connectable to a second transmitter, a third receiver, and a fourth receiver. A third switch can be directly connected to the first switch, the second switch, a first antenna, and a second antenna. A fourth switch can be directly connected to the first switch, the second switch, a third antenna, and a fourth antenna.

According to an implementation of the disclosed technologies, antenna switch diversity circuitry can include five switches. A first switch can be connectable to a first transmitter, a first receiver, and a second receiver. The first switch can be configured to be controlled by a first signal. A second switch can be connectable to a second transmitter, a third receiver, and a fourth receiver. The second switch can be configured to be controlled by the first signal. A third switch can be directly connected to the first switch, the second switch, a first antenna, and a second antenna. The third switch can be configured to be controlled by a second signal. A fourth switch can be directly connected to the first switch, the second switch, a third antenna, and a fourth antenna. The fourth switch can be configured to be controlled by a third signal. A fifth switch can be directly connected to the first switch, the second switch, a fifth antenna, and a sixth antenna. The fifth switch can be configured to be controlled by a fourth signal.

An implementation of the disclosed technologies can include a method for preventing a signal from a first transmitter and a signal from a second transmitter from being conveyed through a same switch. The first transmitter can have a first switch connected to the first transmitter. The second transmitter can have a second switch connected to the second transmitter. The first switch can have a third switch and a fourth switch connected to the first switch. The second switch can have the third switch and the fourth switch connected to the first switch. The first switch and the second switch can be controlled in a manner so as to prevent the signal from the first transmitter and the signal from the second transmitter from being conveyed through the same switch. The same switch can be the third switch or the fourth switch.

An implementation of the disclosed technologies can include a system for preventing a signal from a first transmitter and a signal from a second transmitter from being conveyed through a same switch. The system can include means for having the first transmitter connected to a first switch. The system can include means for having the second transmitter connected to a second switch. The system can include means for having the first switch connected to a third switch and to a fourth switch. The system can include means for having the second switch connected to the third switch and to the fourth switch. The system can include means for controlling the first switch and the second switch in a manner so as to prevent the signal from the first transmitter and the signal from the second transmitter from being conveyed through the same switch. The same switch can be the third switch or the fourth switch.

Additional features, advantages, and embodiments of the disclosed technologies are set forth or apparent from consideration of the following detailed description, drawings, and claims. Moreover, it is to be understood that both the foregoing summary and the following detailed description are illustrative and are intended to provide further explanation without limiting the scope of the claims.

BRIEF DESCRIPTION OF THE DRAWINGS

The accompanying drawings, which are included to provide a further understanding of the disclosed technologies, are incorporated in and constitute a part of this specification. The drawings also illustrate embodiments of the disclosed technologies and together with the detailed description serve to explain the principles of implementations of the disclosed technologies. No attempt is made to show structural details in more detail than may be necessary for a fundamental understanding of the disclosed technologies and various ways in which it may be practiced.

DETAILED DESCRIPTION

Figure 1:
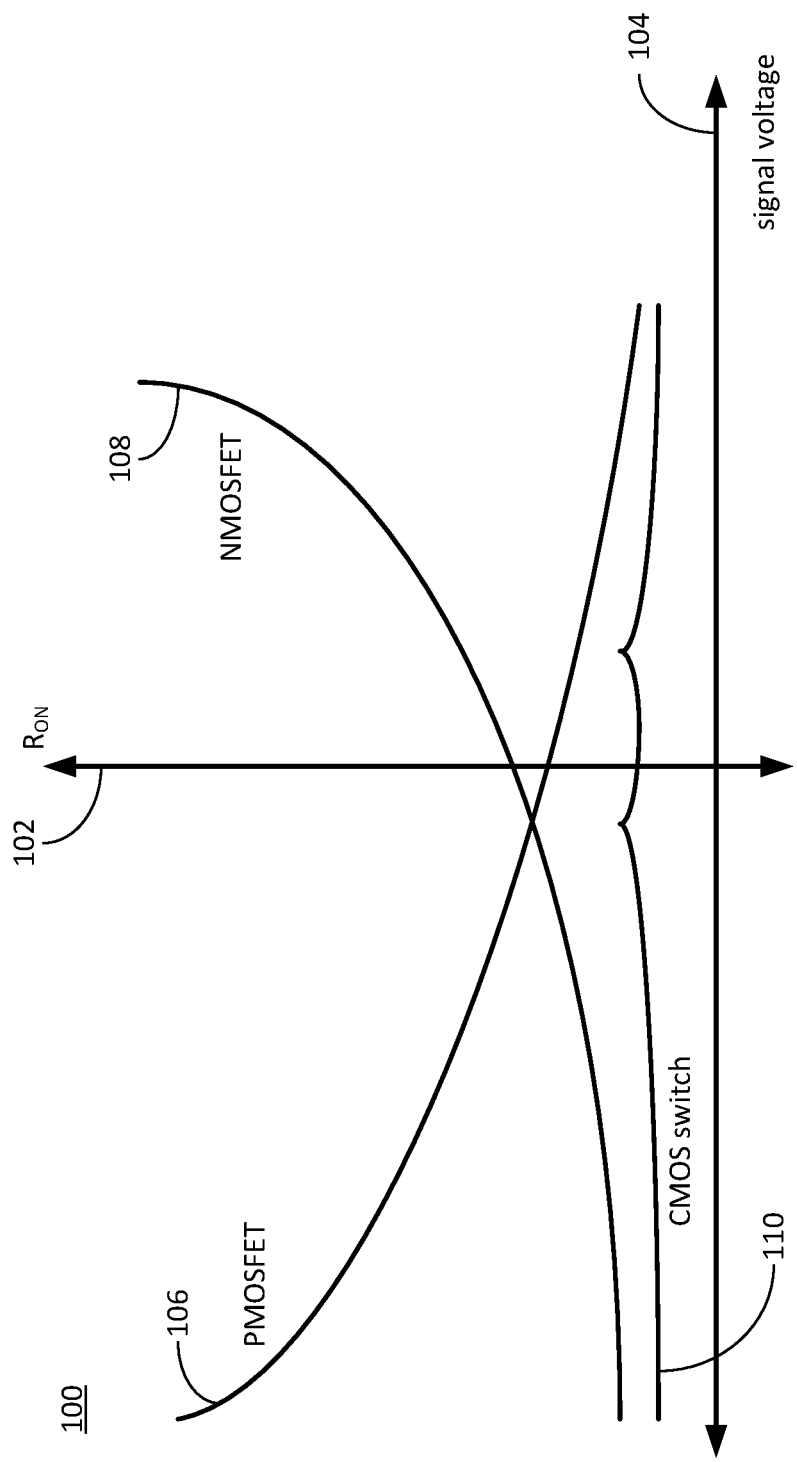
FIG. 1 is a presentation of graphs of on-resistances as functions of signal voltage for various field-effect transistors.

As used herein, a statement that a component can be "configured to" perform an operation can be understood to mean that the component requires no structural alterations, but merely needs to be placed into an operational state (e.g., be provided with electrical power, have an underlying operating system running, etc.) in order to perform the operation.

A diversity scheme can be a technique used to improve a reliability of a communication of a signal propagated through space as a radio wave. Such a signal can be susceptible to fading, co-channel interference, or both. The diversity scheme can provide for multiple versions of the signal to be communicated through multiple channels. So, for example, if one version of the signal is communicated through a channel that experiences a high degree of fading, but another version of the signal is communicated through a channel that does not experience a high degree of fading, then a combination of the multiple versions of the signal by a receiver can improve the reliability of the communication of the signal.

The diversity scheme can include, for example, multiple antennas to transmit and/or receive the multiple versions of the signal. Such a diversity scheme can be referred to as antenna diversity. Antenna diversity can include techniques with respect to types and arrangements of the multiple antennas and techniques with respect to processing the multiple versions of the signal. For example, the multiple antennas can be arranged so that one antenna is physically separated from another antenna. Such a technique can be referred to as spatial diversity. Spatial diversity is common in broadband cellular network technology. In broadband cellular network technology, antennas can be disposed on base stations, which can be miles apart to produce multiple signal paths for the multiple versions of the signal. Moreover, in broadband cellular network technology, antennas can be disposed at separate locations on a mobile communications device (e.g., a smartphone) so that it is unlikely that a hand holding the mobile communications device will block all of the antennas on the mobile communications device. Additionally, for example, the mobile communications device can include an algorithm to switch from a first antenna to a second antenna in response to a measurable condition. Such a technique can be referred to as antenna switch diversity.

The measurable condition can include, for example: (1) a determination that a strength of a version of the signal communicated through an antenna is below a threshold signal strength, (2) a determination that a difference between a reference signal power received by a first (e.g., primary) antenna and a reference signal power received by a second (e.g., diversity) antenna is greater than a threshold value, (3) a determination that a maximum transmit power limit has been reached for at least a specific duration of time, (4) the like, or (5) any combination thereof.

Use of spatial diversity and antenna switch diversity can require a mobile communications device to include more antennas, switches, and other circuitry than the mobile device may include in an absence of the use of such techniques. Fortunately, such circuitry often can be configured in a manner so that a component can be used for more than one function. For example, switches can be configured so that a same antenna can be used both to receive a version of a signal and to transmit a version of a signal. Additionally, for example, switches can be configured so that if a first antenna is performing the function of a primary antenna and a second antenna is performing the function of a diversity antenna, then in response to the measurable condition that causes a switch to another antenna, the second antenna can be switched to perform the function of the primary antenna and the first antenna can be switched to perform the function of the diversity antenna.

The additional antennas, switches, and other circuitry can also be included in a mobile communications device manufactured for use during a period of transition from a first broadband cellular network technology to a second broadband cellular network technology. For example, often during such a period of transition mobile communications devices can be manufactured to perform some functions (e.g., communication of control signals) using the first broadband cellular network technology and to perform other functions (e.g., communication of data signals) using the second broadband cellular network technology. Such a configuration can be referred to as a non-standalone architecture. A mobile communication device manufactured with a non-standalone architecture can also include: (1) one or more transmitters configured to operate using the first broadband cellular network technology, (2) one or more receivers configured to operate using the first broadband cellular network technology, (3) one or more transmitters configured to operate using the second broadband cellular network technology, and (4) one or more receivers configured to operate using the second broadband cellular network technology. For example, the current period of transition from the broadband cellular network technology that complies with the International Mobile Telecommunications Advanced specification of the International Telecommunication Union (more commonly referred to as 4G) to the broadband cellular network technology that complies with the IMT-2020 standard of the International Telecommunication Union (more commonly referred to as 5G) is characterized by mobile communication devices manufactured with a non-standalone architecture.

Often, a switch used for antenna switch diversity can be a complementary metal-oxide-semiconductor field-effect transistor switch (CMOS switch). A CMOS switch can include a p-channel metal-oxide-semiconductor field-effect transistor (PMOSFET) connected in parallel with an n-channel metal-oxide-semiconductor field-effect transistor (NMOSFET). Realistically, a resistance of a field-effect transistor in which the field-effect transistor is on (i.e., on-resistance ($R_{ON}$)) can vary in a nonlinear manner as a function of a signal voltage. FIG. 1 is a presentation of graphs 100 of on-resistances 102 as functions of signal voltage 104 for various field-effect transistors. The graphs 100 include a graph 106 for a PMOSFET, a graph 108 for an NMOSFET, and a graph 110 for a CMOS switch.

Figure 2:
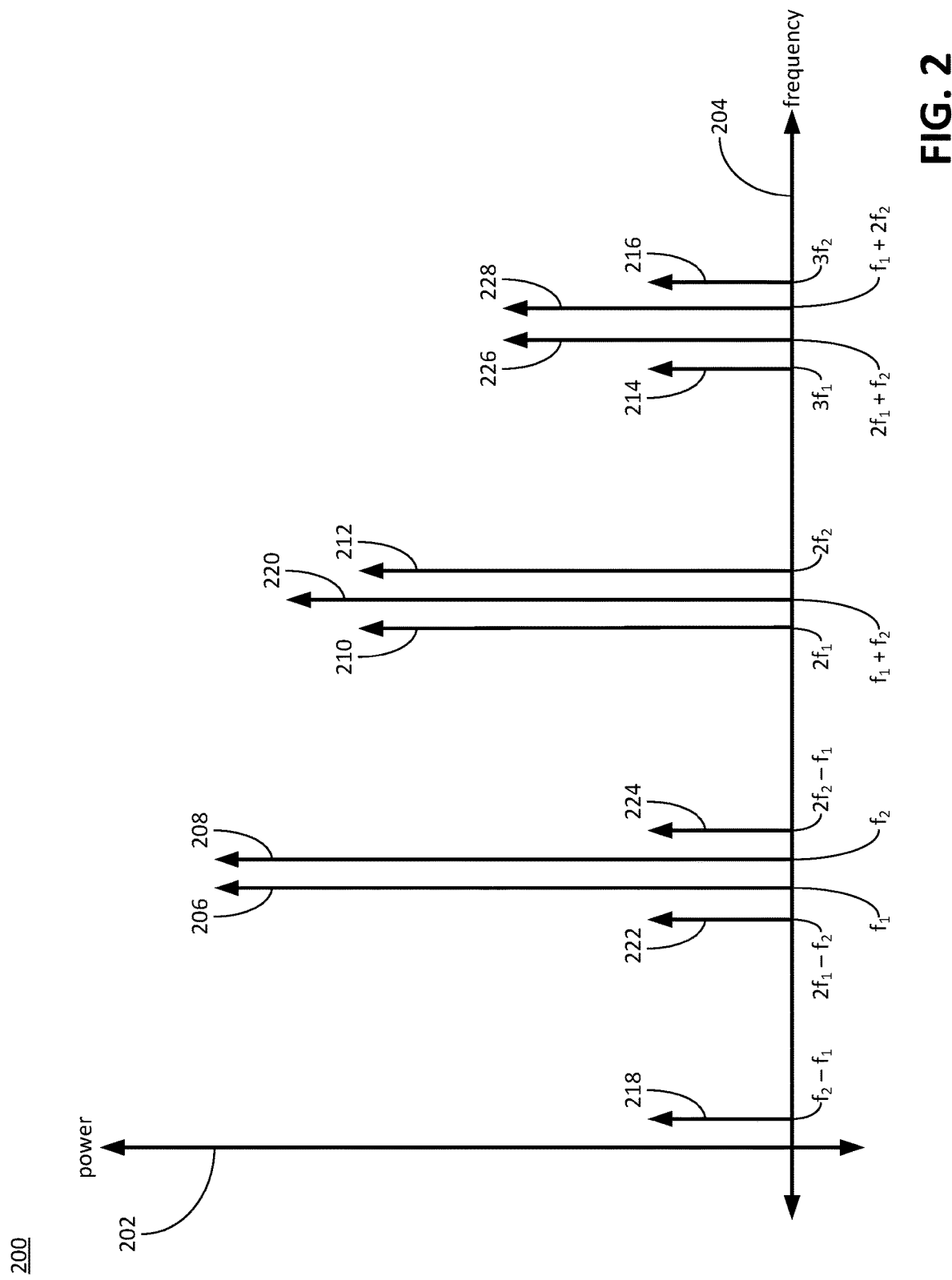
FIG. 2 is a presentation of graphs of power as a function of frequency to illustrate relationships between signals at carrier frequencies and intermodulation distortion signals.

Unfortunately, such nonlinear on-resistance and other nonlinear characteristics of a CMOS switch can produce, in a non-standalone architecture in which a first broadband cellular network technology uses a first carrier frequency and a second broadband cellular network technology uses a second carrier frequency, intermodulation distortion signals. FIG. 2 is a presentation of graphs 200 of power 202 as a function of frequency 204 to illustrate relationships between signals at carrier frequencies and intermodulation distortion signals. The graphs 200 can include a graph 206 for a first carrier frequency ($f_1$) and a graph 208 for a second carrier frequency ($f_2$). Additionally, the graphs 200 can include a graph 210 for a second harmonic of the first carrier frequency ($2f_1$), a graph 212 for a second harmonic of the second carrier frequency ($2f_2$), a graph 214 for a third harmonic of the first carrier frequency ($3f_1$), and a graph 216 for a third harmonic of the second carrier frequency ($3f_2$). Furthermore, the graphs 200 can include a graph 218 for a first second-order distortion signal ($f_2-f_1$), a graph 220 for a second second-order distortion signal ($f_1+f_2$), a graph 222 for a first third-order distortion signal ($2f_1-f_2$), a graph 224 for a second third-order distortion signal ($2f_2-f_1$), a graph 226 for a third third-order distortion signal ($2f_1+f_2$), and a graph 228 for a fourth third-order distortion signal ($f_1+2f_2$). As illustrated in FIG. 2, the first third-order distortion signal ($2f_1-f_2$) (graph 222) and the second third-order distortion signal ($2f_2-f_1$) (graph 224) can be of particular concern because of their proximities to the first carrier frequency ($f_1$) (graph 206) and the second carrier frequency ($f_2$) (graph 208). Such intermodulation distortion signals can present problems in meeting regulatory requirements about degrees to which spurious emissions are tolerated within a broadband cellular network channel. Such intermodulation distortion signals can also degrade a sensitivity of a receiver of a mobile communications device, particularly in a situation in which the intermodulation distortion signals are at frequencies within one or more channels at which the receiver is configured to operate.

The disclosed technologies can reduce, in a non-standalone architecture in which the first broadband cellular network technology uses a first carrier frequency and the second broadband cellular network technology uses a second carrier frequency, a production of an intermodulation distortion signal by a transmitter configured to operate using the first broadband cellular network technology and a transmitter configured to operate using the second broadband cellular network technology.

The disclosed technologies can include, for example, antenna switch diversity circuitry with four switches. A first switch can be connectable to a first transmitter, a first receiver, and a second receiver. A second switch can be connectable to a second transmitter, a third receiver, and a fourth receiver. A third switch can be directly connected to the first switch, the second switch, a first antenna, and a second antenna. A fourth switch directly can be connected to the first switch, the second switch, a third antenna, and a fourth antenna. The first and second switches can be configured to be controlled by a control signal in a manner so as to prevent a signal from the first transmitter and a signal from the second transmitter from being conveyed through a same switch, which can reduce a production of an intermodulation distortion signal by the signal from the first transmitter and the signal from the second transmitter.

Figure 3:
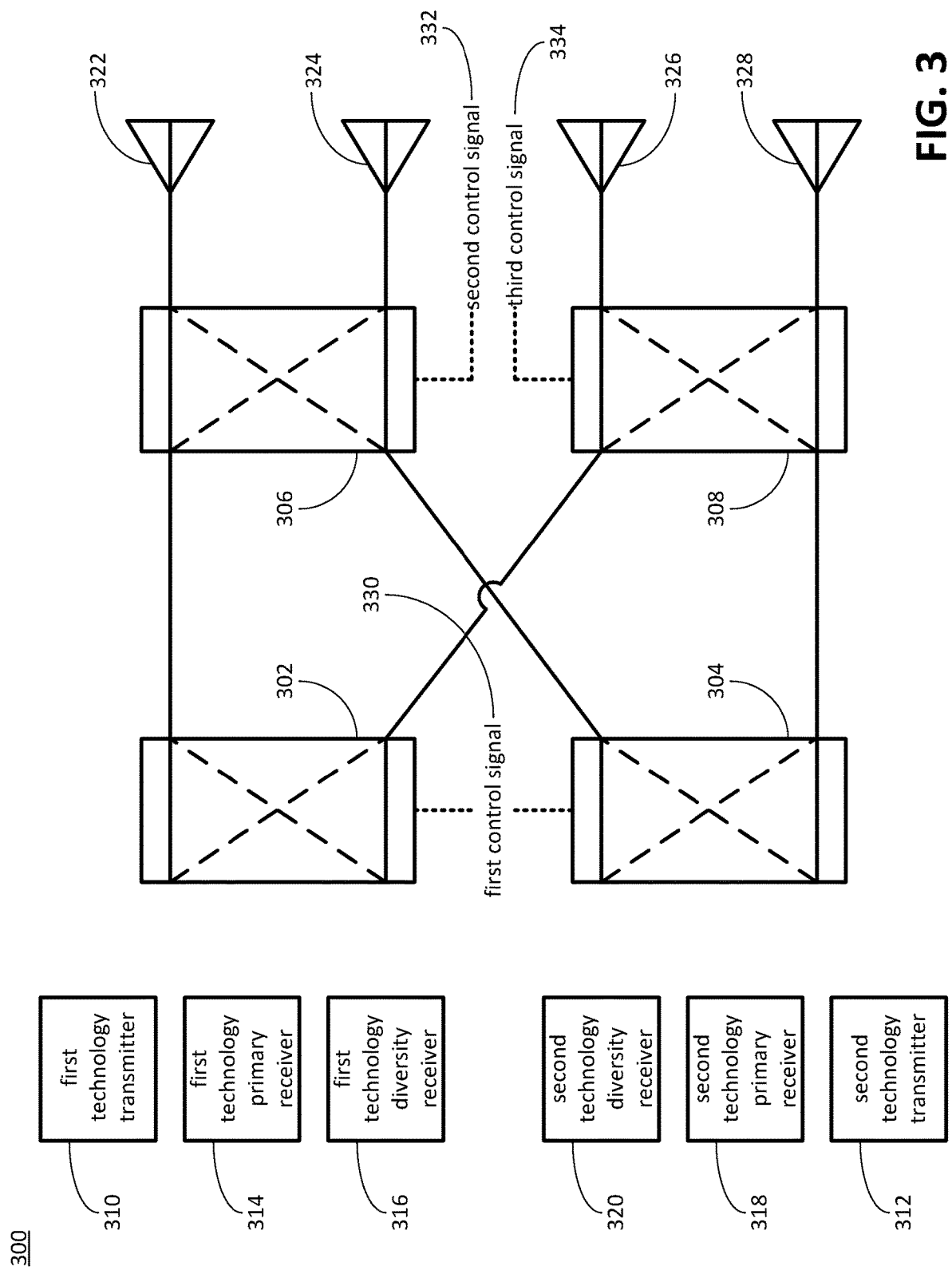
FIG. 3 is a block diagram of an example of antenna switch diversity circuitry, according to the disclosed technologies.

FIG. 3 is a block diagram of an example of antenna switch diversity circuitry 300, according to the disclosed technologies. The antenna switch diversity circuitry 300 can include, for example, a switch 302, a switch 304, a switch 306, a switch 308, a transmitter 310, a transmitter 312, a receiver 314, a receiver 316, a receiver 318, a receiver 320, an antenna 322, an antenna 324, an antenna 326, and an antenna 328.

The switch 302 can be connectable to the transmitter 310, the receiver 314, and the receiver 316. For example, a first input of the switch 302 can be connectable to the transmitter 310 and the receiver 314, and a second input of the switch 302 can be connectable to the receiver 316. For example, the transmitter 310 and the receiver 314 can be connectable to the first input of the switch 302 by one or more of a switch (not illustrated), a duplexer (not illustrated), or the like. For example, the receiver 316 can be connectable to the second input of the switch 302 by a direct connection (not illustrated), a switch (not illustrated), or the like.

The switch 304 can be connectable to the transmitter 312, the receiver 318, and the receiver 320. For example, a first input of the switch 304 can be connectable to the transmitter 312 and the receiver 318, and a second input of the switch 304 can be connectable to the receiver 320. For example, the transmitter 312 and the receiver 318 can be connectable to the first input of the switch 304 by one or more of a switch (not illustrated), a duplexer (not illustrated), or the like. For example, the receiver 320 can be connectable to the second input of the switch 304 by a direct connection (not illustrated), a switch (not illustrated), or the like.

The switch 306 can be directly connected to the switch 302, the switch 304, the antenna 322, and the antenna 324.

The switch 308 can be directly connected to the switch 302, the switch 304, the antenna 326, and the antenna 328.

The switch 302 can be configured to be controlled by a first control signal 330. The switch 304 can be configured to be controlled by the first control signal 330. The switch 306 can be configured to be controlled by a second control signal 332. The switch 308 can be configured to be controlled by a third control signal 334. The first control signal 330 can control the switch 302 and the switch 304 in a manner so as to prevent a signal from the transmitter 310 and a signal from the transmitter 312 from being conveyed through a same switch. Additionally or alternatively, the first control signal 330 can control the switch 302 and the switch 304 in a manner so as to reduce a production of an intermodulation distortion signal by a signal from the transmitter 310 and a signal from the transmitter 312. For example, the signal from the transmitter 310 can have a first carrier frequency ($f_1$) and the signal from the transmitter 312 can have a second carrier frequency ($f_2$). The second carrier frequency ($f_2$) can be different from the first carrier frequency ($f_1$).

The transmitter 310 can be for a first type of broadband cellular network technology. For example, the first type of broadband cellular network technology can comply with the International Mobile Telecommunications Advanced specification of the International Telecommunication Union (more commonly referred to as 4G). The transmitter 312 can be for a second type of broadband cellular network technology. For example, the second type of broadband cellular network technology can comply with the IMT-2020 standard of the International Telecommunication Union (more commonly referred to as 5G).

The receiver 314 and the receiver 316 can be for a first type of broadband cellular network technology. For example, the receiver 314 can be a primary receiver for the first type of broadband cellular network technology and the receiver 316 can be a diversity receiver for the first type of broadband cellular network technology. Alternatively, for example, the receiver 314 can be the diversity receiver for the first type of broadband cellular network technology and the receiver 316 can be the primary receiver for the first type of broadband cellular network technology. For example, the first type of broadband cellular network technology can comply with the International Mobile Telecommunications Advanced specification of the International Telecommunication Union (more commonly referred to as 4G).

The receiver 318 and the receiver 320 can be for a second type of broadband cellular network technology. For example, the receiver 318 can be a primary receiver for the second type of broadband cellular network technology and the receiver 320 can be a diversity receiver for the second type of broadband cellular network technology. Alternatively, for example, the receiver 318 can be the diversity receiver for the second type of broadband cellular network technology and the receiver 320 can be the primary receiver for the second type of broadband cellular network technology. For example, the second type of broadband cellular network technology can comply with the IMT-2020 standard of the International Telecommunication Union (more commonly referred to as 5G).

Alternatively, the receiver 314 and the receiver 316 can be for the second type of broadband cellular network technology, and the receiver 318 and the receiver 320 can be for the first type of broadband cellular network technology.

One or more of the switches 302, 304, 306, and 308 can include, for example, a relay, a microelectromechanical (MEMS) switch, a triac, a transistor, the like, or any combination thereof. If one or more of the switches 302, 304, 306, and 308 includes a transistor, then the transistor can be, for example, a bipolar junction transistor (BJT), a junction gate field-effect transistor (JFET), a metal-oxide-semiconductor field-effect transistor (MOSFET), the like, or any combination thereof. If one or more of the switches 302, 304, 306, and 308 includes a MOSFET, then the MOSFET can be, for example, a p-channel metal-oxide-semiconductor field-effect transistor (PMOSFET), an n-channel metal-oxide-semiconductor field-effect transistor (NMOSFET), or a complementary metal-oxide-semiconductor field-effect transistor switch (CMOS switch).

One or more of the switches 302, 304, 306, and 308 can include a crossover switch.

Figure 4:
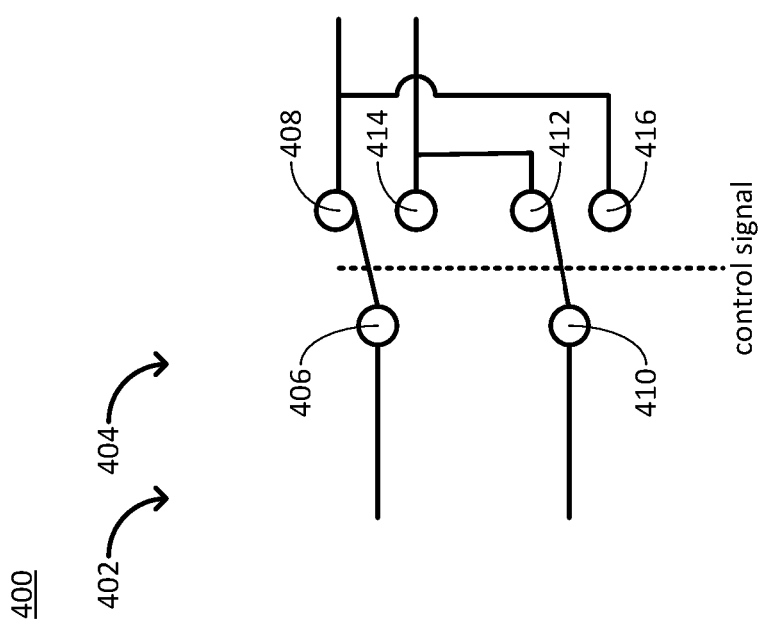
FIG. 4 is a schematic diagram of a first example of a crossover switch.

FIG. 4 is a schematic diagram of a first example 400 of a crossover switch 402. The first example 400 of the crossover switch 402 can include a double pole, double throw switch 404. The double pole, double throw switch 404 can be configured to be controlled so that: (1) in a first position, a first pole 406 can be connected to a first output 408 associated with the first pole 406, and a second pole 410 can be connected to a first output 412 associated with the second pole 410 and (2) in a second position, the first pole 406 can be connected to a second output 414 associated with the first pole 406, and the second pole 410 can be connected to a second output 416 associated with the second pole 410. The first output 408 associated with the first pole 406 can be connected to the second output 416 associated with the second pole 410. The second output 414 associated with the first pole 406 can be connected to the first output 412 associated with the second pole 410.

Figure 5:
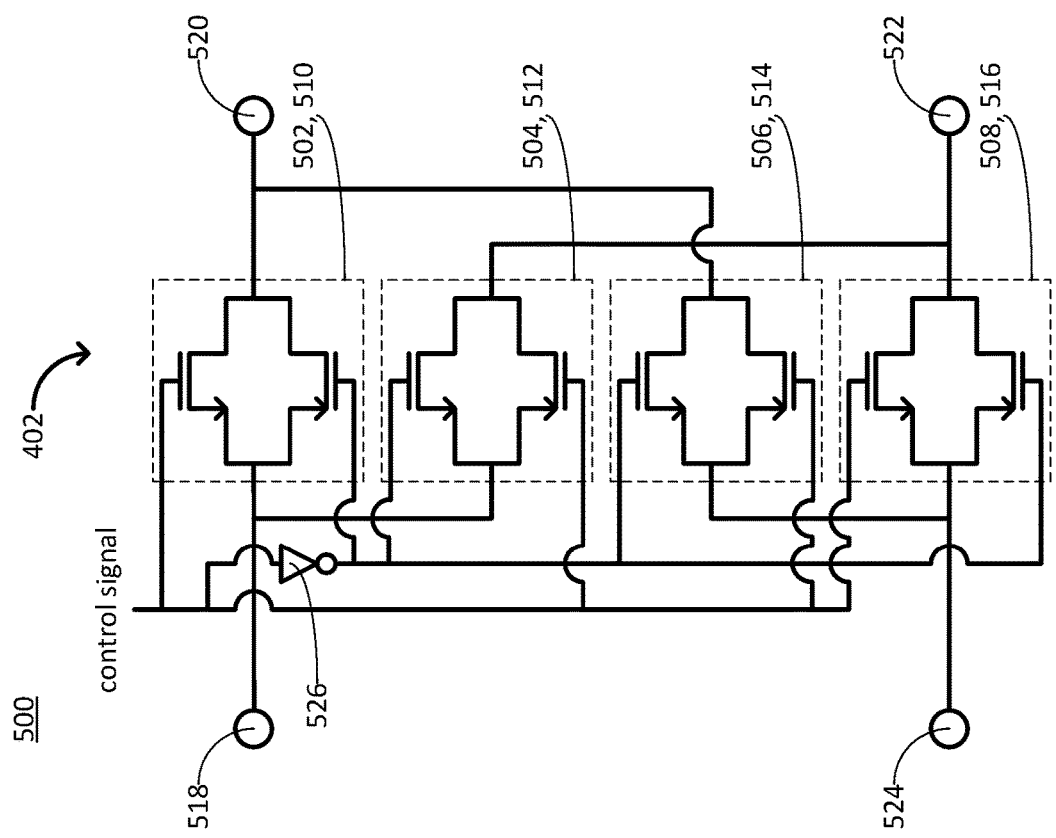
FIG. 5 is a schematic diagram of a second example of a crossover switch.

FIG. 5 is a schematic diagram of a second example 500 of the crossover switch 402. The second example 500 of the crossover switch 402 can include, for example, an electronic switch 502, an electronic switch 504, an electronic switch 506, and an electronic switch 508. One or more of the switches 502, 504, 506, and 508 can include, for example, a complementary metal-oxide-semiconductor field-effect transistor switch (CMOS switch). For example, the electronic switch 502 can include a CMOS switch 510, the electronic switch 504 can include a CMOS switch 512, the electronic switch 506 can include a CMOS switch 514, and the electronic switch 508 can include a CMOS switch 516. The electronic switch 502 can be connected between a first input port 518 and a first output port 520. The electronic switch 504 can be connected between the first input port 518 and a second output port 522. The electronic switch 506 can be connected between a second input port 524 and the first output port 520. The electronic switch 508 can be connected between the second input port 524 and the second output port 522.

The second example 500 of the crossover switch 402 can further include an inverter 526. The inverter 526 can be configured to cause both an n-channel metal-oxide-semiconductor field-effect transistor (NMOSFET) of a CMOS switch and a p-channel metal-oxide-semiconductor field-effect transistor (PMOSFET) of the CMOS switch to be either on currently or off currently. The inverter 526 can be configured to cause both the electronic switch 502 and the electronic switch 508 to be on concurrently with both the electronic switch 504 and the electronic switch 506 being off. The inverter 526 can be configured to cause both the electronic switch 504 and the electronic switch 506 to be on concurrently with both the electronic switch 502 and the electronic switch 508 being off.

With reference to FIGS. 3 and 5, because a CMOS switch is a non-ideal switch, there can be a situation, for example, in which, during a transition to cause both the electronic switch 502 and the electronic switch 508 to be on and both the electronic switch 504 and the electronic switch 506 to be off, all four electronic switches 502, 504, 506, and 508 are on. Thus, having: (1) the transmitter 310 connectable to the switch 302, (2) the transmitter 312 connectable to the switch 304, and (3) the first control signal 330 control the switch 302 and the switch 304 in a manner so as to prevent a signal from the transmitter 310 and a signal from the transmitter 312 from being conveyed through a same switch can reduce a production of an intermodulation distortion signal by the signal from the transmitter 310 and the signal from the transmitter 312.

Figure 6:
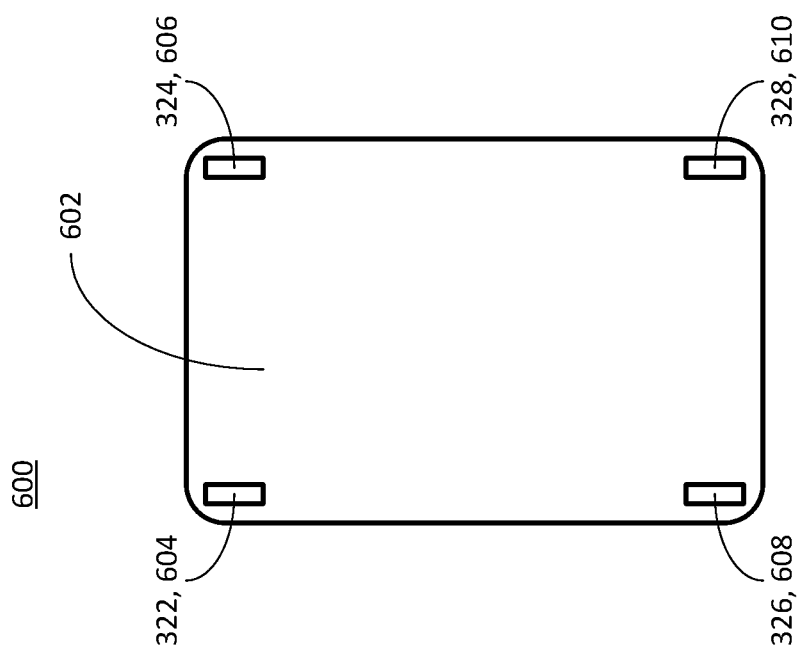
FIG. 6 is a diagram of a mobile communications device that includes the antenna switch diversity circuitry, according to the disclosed technologies.

The antenna switch diversity circuitry 300 can be disposed in a mobile communications device. FIG. 6 is a diagram of a mobile communications device 600 that includes the antenna switch diversity circuitry, according to the disclosed technologies. The mobile communications device 600 can include a housing 602. The antenna 322 can be disposed near a corner 604 of the housing 602. The antenna 324 can be disposed near a corner 606 of the housing 602. The antenna 326 can be disposed near a corner 608 of the housing 602. The antenna 328 can be disposed near a corner 610 of the housing 602. Alternatively, the antennas 322, 324, 326, and 328 can be disposed in the mobile communications device 600 according to one or more other arrangements.

Figure 7:
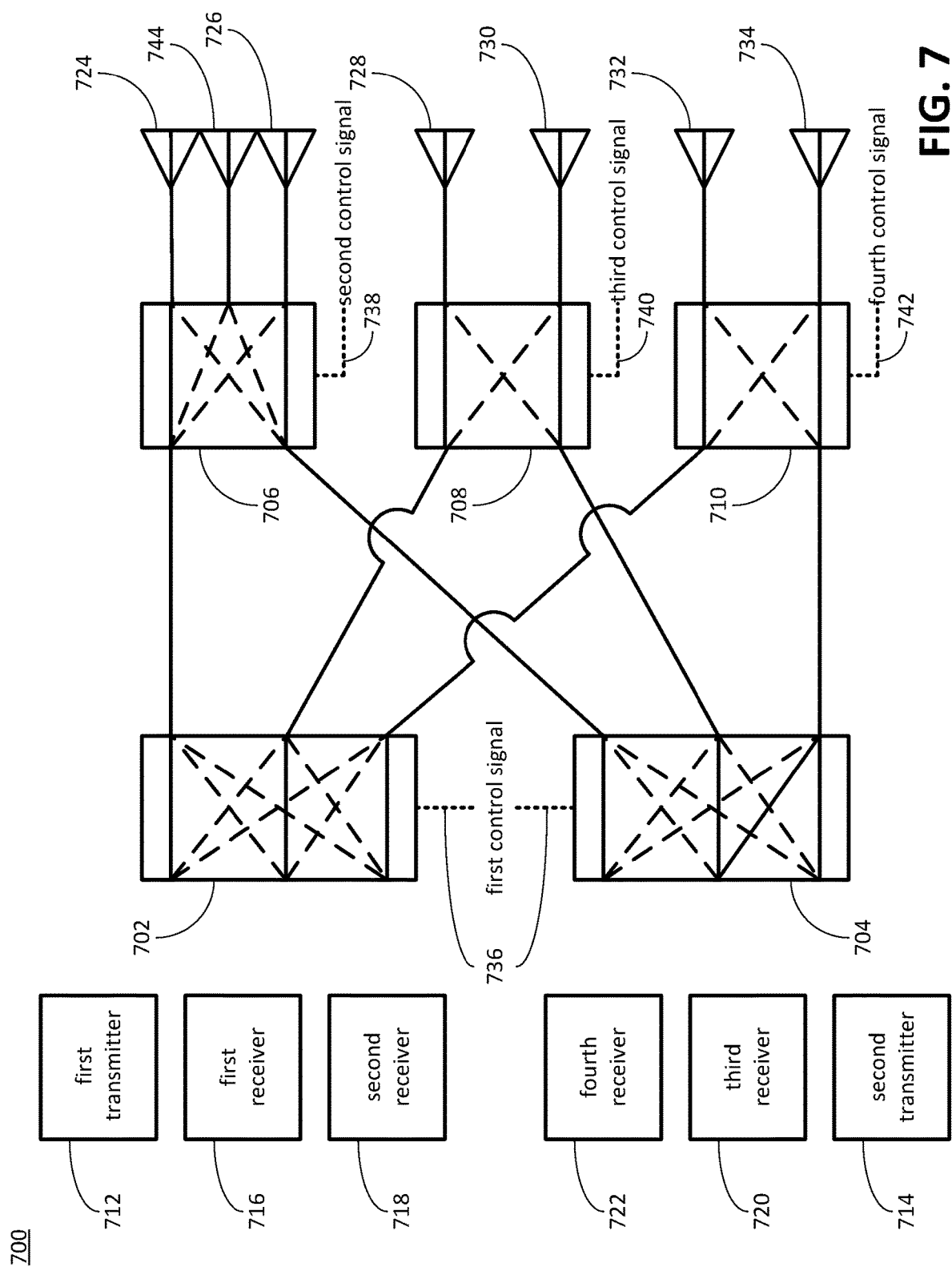
FIG. 7 is a block diagram of another example of antenna switch diversity circuitry, according to the disclosed technologies.

FIG. 7 is a block diagram of another example of antenna switch diversity circuitry 700, according to the disclosed technologies. The antenna switch diversity circuitry 700 can include, for example, a switch 702, a switch 704, a switch 706, a switch 708, a switch 710, a transmitter 712, a transmitter 714, a receiver 716, a receiver 718, a receiver 720, a receiver 722, an antenna 724, an antenna 726, an antenna 728, an antenna 730, an antenna 732, and an antenna 734.

The switch 702 can be connectable to the transmitter 712, the receiver 716, and the receiver 718. For example, a first input of the switch 702 can be connectable to the transmitter 712 by one or more of a direct connection (not illustrated), a switch (not illustrated), or the like. For example, a second input of the switch 702 can be connectable to the receiver 716 by one or more of a direct connection (not illustrated), a switch (not illustrated), or the like. For example, a third input of the switch 702 can be connectable to the receiver 718 by one or more of a direct connection (not illustrated), a switch (not illustrated), or the like.

The switch 704 can be connectable to the transmitter 714, the receiver 720, and the receiver 722. For example, a first input of the switch 704 can be connectable to the transmitter 714 by one or more of a direct connection (not illustrated), a switch (not illustrated), or the like. For example, a second input of the switch 704 can be connectable to the receiver 720 by one or more of a direct connection (not illustrated), a switch (not illustrated), or the like. For example, a third input of the switch 704 can be connectable to the receiver 722 by one or more of a direct connection (not illustrated), a switch (not illustrated), or the like.

The switch 706 can be directly connected to the switch 702, the switch 704, the antenna 724, and the antenna 726.

The switch 708 can be directly connected to the switch 702, the switch 704, the antenna 728, and the antenna 730.

The switch 710 can be directly connected to the switch 702, the switch 704, the antenna 732, and the antenna 734.

The switch 702 can be configured to be controlled by a first control signal 736. The switch 704 can be configured to be controlled by the first control signal 736. The switch 706 can be configured to be controlled by a second control signal 738. The switch 708 can be configured to be controlled by a third control signal 740. The switch 710 can be configured to be controlled by a fourth control signal 742.

Optionally, the antenna switch diversity circuitry 700 can further include an antenna 744. The switch 706 can be further directly connected to the antenna 744.

Figure 8:
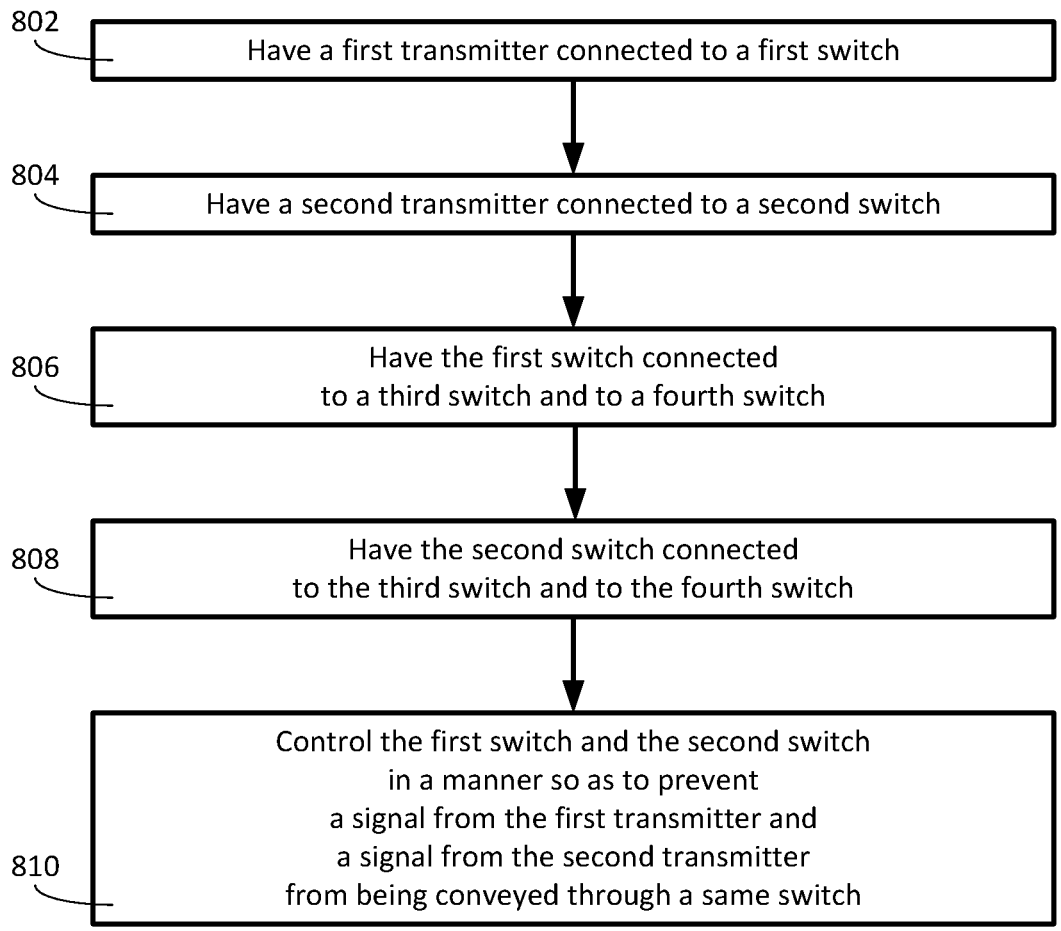
FIG. 8 is a flow diagram of an example of a method for preventing a signal from a first transmitter and a signal from a second transmitter from being conveyed through a same switch, according to the disclosed technologies.

FIG. 8 is a flow diagram of an example of a method 800 for preventing a signal from a first transmitter and a signal from a second transmitter from being conveyed through a same switch, according to the disclosed technologies. In the method 800, at an operation 802, the first transmitter can have a first switch connected to the first transmitter. At an operation 804, the second transmitter can have a second switch connected to the second transmitter. At an operation 806, the first switch can have a third switch and a fourth switch connected to the first switch. At an operation 808, the second switch can have the third switch and the fourth switch connected to the first switch. At an operation 810, the first switch and the second switch can be controlled in a manner so as to prevent the signal from the first transmitter and the signal from the second transmitter from being conveyed through the same switch. The same switch can be the third switch or the fourth switch.

Figure 9:
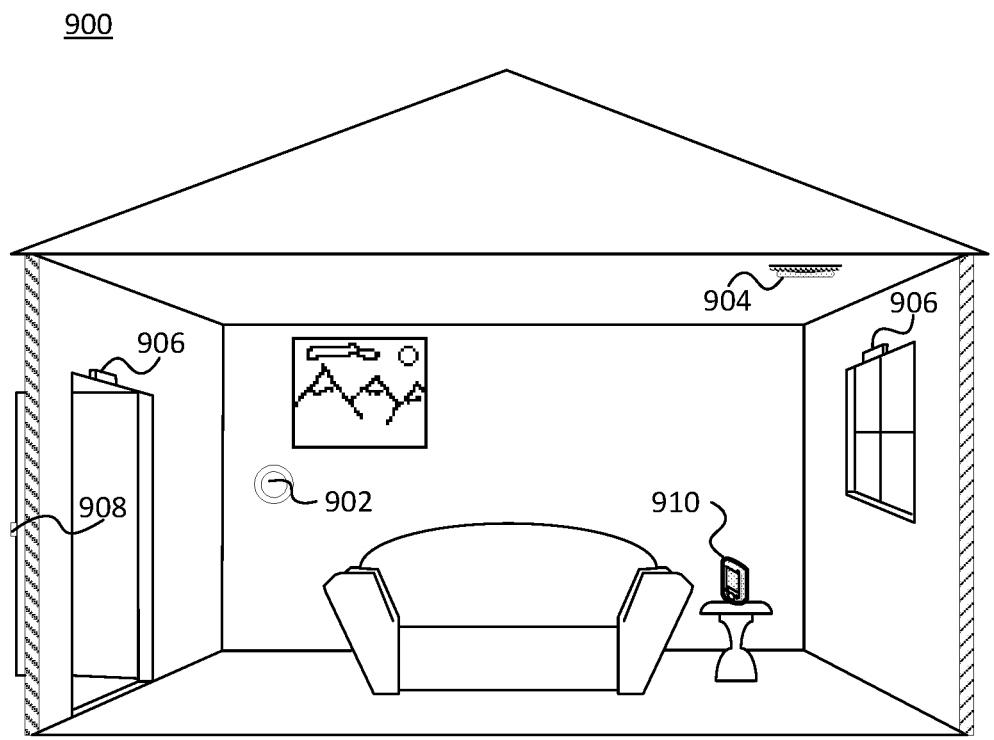
FIG. 9 is a diagram of an example environment for a security system integrated in a smart home environment.

FIG. 9 is a diagram of an example environment 900 for a security system integrated in a smart home environment that can include sensors, interface components, and one or more processing units that process data generated by the sensors and that control the interface components. Data from the sensors can be used to determine the occurrence of a security breach or security related event, such as entry through a window of the premises, lengthy presence of an individual in an unusual location and an unusual time, or tampering with a lock of a door of the premises, etc. Upon the occurrence of such an event, the security system can determine, based on any of various algorithms, that an alarm is warranted and enter into an alarm mode, which can include automatically notifying a third party monitoring service as well as operating components of the system to provide visual and/or audible alerts, such as a siren sound, repeated beeping sound, or flashing lights.

Additionally, the security system can determine where a security breach has occurred and thereafter track the location of the unauthorized party, as well as the locations of authorized parties within and/or around the premises. Additionally, in view of the high stress levels that can accompany experiencing an unauthorized intrusion, the security system can announce the location of the security breach and the location of the unauthorized party within the premises. In so doing the authorized occupants are automatically warned of which locations in/around the premises to avoid and the unauthorized party is simultaneously deterred from further advance due to the clear notice to the unauthorized party that he/she is being tracked. Alternatively, the location of the unauthorized party can be announced only to select devices so as to inform an authorized user while leaving the unauthorized party unaware that he/she is being tracked.

The security system can function as a subsystem of a smart facility network system and can incorporate a plurality of electrical and/or mechanical components, including intelligent, sensing, network-connected devices that can communicate with each other and/or can communicate with a central server or a cloud-computing system to provide any of a variety of security (and/or environment) management objectives in a home, office, building or the like. Such objectives, which can include, for example, managing alarms, notifying third parties of alarm situations, managing door locks, monitoring the premises, etc., herein are collectively referred to as "premises management."

A premises management system can further include other subsystems that can communicate with each other to manage different aspects of premises management as well as security. For example, a security subsystem can manage the arming, disarming, and activation of alarms and other security aspects of the premises, and a smart home environment subsystem can handle aspects such as light, temperature, and hazard detection of the premises. However, the premises management system can leverage data obtained in one subsystem to improve the functionality of another subsystem.

The security system can be operable to function in any of various modes or states. For example, security system modes can include "stay", "away" and "home" modes. In a "stay" mode the security system can operate under the assumption that authorized parties are present within the premises but will not be entering/leaving without notifying the system; therefore data from certain interior sensors can be given lower weight in determining whether an unauthorized party is present. In an "away" mode the security system can operate under the assumption that no authorized parties are in the premises; therefore data from all sensors, interior and exterior, can be accorded high weight in determining whether an unauthorized party is present. In a "home" mode the security system can operate under the assumption that authorized parties are within the premises and will be freely entering/leaving the premises without notifying the system; therefore data from certain sensors interior and exterior can be accorded low weight in determining whether an unauthorized party is present. It should be understood that these modes are merely examples and can be modified, removed, or supplemented by other modes.

Additionally, the security system can function in any of various alarm states. For example, in a "green" or "low"

alarm state the security system can operate under the assumption that all is well and no unauthorized parties have been detected within/around the premises. In a "yellow" or "medium" alarm state the security system can operate under the assumption that an unauthorized party is potentially present in or around the premises. In this state certain sensor data can be analyzed differently or additional confirmations of authorization, such as entering a code, can be required of to avoid escalation to a higher alarm state. In a "red" or "high" alarm state the security system can operate under the assumption that an unauthorized party has been detected on the premises and preventive measures can be taken, such as notifying a third party monitoring service and/or activating an alarm and announcement, as will be described later. It should be understood that greater or fewer gradients of alarm state can be included. Hereinafter, a heightened alarm can refer to an alarm state above the low alarm state.

The security system can be implemented as a stand-alone system or, as mentioned above, as a subsystem of a larger premises management system and can leverage data therefrom. For illustrative purposes and to demonstrate the cross use of data among systems, the security system can be part of a premises management system, such as a smart home network environment.

The individual hardware components of the premises management system that can be used to monitor and affect the premises in order to carry out premises management can be referred to as "premises management devices." The premises management devices described herein can include multiple physical hardware and firmware configurations, along with circuitry hardware (e.g., processors, memory, etc.), firmware, and software programming that are configured to carry out the methods and functions of a premises management system. The premises management devices can be controlled by a "brain" component, which can be implemented in a controller device.

The system 900 can implement subsystems, including the security system, via multiple types of premises management devices, such as one or more intelligent, multi-sensing, network-connected thermostats 902, one or more intelligent, multi-sensing, network-connected hazard detection units 904, one or more intelligent, multi-sensing, network-connected entry detection units 906, one or more network-connected door handles 908, one or more intelligent, multi-sensing, network-connected controller devices 910, or any combination thereof. Data from any of these premise management devices can be used by the security system, as well as for the respective primary functions of the premise management devices.

At a high level, the system 900 can be configured to operate as a learning, evolving ecosystem of interconnected devices. New premises management devices can be added, introducing new functionality, expanding existing functionality, or expanding a spatial range of coverage of the system. Furthermore, existing premises management devices can be replaced or removed without causing a failure of the system 900. Such removal can encompass intentional or unintentional removal of components from the system 900 by an authorized user, as well as removal by malfunction (e.g., loss of power, destruction by intruder, etc.). Due to the dynamic nature of the system, the overall capability, functionality and objectives of the system 900 can change as the constitution and configuration of the system 900 change.

In order to avoid contention and race conditions among the interconnected devices, certain decisions, such as those that affect the premises management system 900 at a system level or that involve data from multiple sources, can be centralized in the aforementioned "brain" component. The brain component can coordinate decision making across the system 900 or across a designated portion thereof. The brain component is a system element at which, for example, sensor/detector states can converge, user interaction can be interpreted, sensor data can be received, and decisions can be made concerning the state, mode, or actions of the system 900. Hereinafter, the system 900 brain component can be referred to as the "primary system processor." The function of primary system processor can be implemented in the controller device 910, for example, hard coded into a single device, or distributed virtually among one or more premises management devices within the system using computational load sharing, time division, shared storage, or other techniques.

However implemented, the primary system processor can be configured to control subsystems and components of the premises management system 900, such as, for example, the disclosed security system and/or a smart home environment system. Furthermore, the primary system processor can be communicatively connected to control, receive data from, or transmit data to premises management devices within the system, as well as receive data from or transmit data to devices/systems external to the system 900, such as third party servers, cloud servers, mobile devices, and the like.

In the embodiments disclosed herein, each of the premises management devices can include one or more sensors. In general, a "sensor" can refer to any device that can obtain information about its local environment and communicate that information in the form of data that can be stored or accessed by other devices and/or systems. Sensor data can form the basis of inferences drawn about the sensor's environment. For example, the primary system processor can use data from a plurality of sensors, e.g., including entry detection unit 906, to determine whether an unauthorized party is attempting enter the house through a window.

A brief description of sensors that may be included in the system 900 follows. Examples provided are not intended to be limiting but are merely provided as illustrative subjects. The system 900 can use data from the types of sensors in order to implement features of a security system. The system 900 can employ data from any type of sensor that provides data from which an inference can be drawn about the environment in or around the house.

Generally, sensors can be described by the type of information they collect. For example, sensor types can include motion, smoke, carbon monoxide, proximity, temperature, time, physical orientation, acceleration, location, entry, presence, pressure, light, sound, and the like. A sensor also can be described in terms of the particular physical device that obtains the environmental information. For example, an accelerometer can obtain acceleration information, and thus can be used as a general motion sensor and/or an acceleration sensor. A sensor also can be described in terms of the specific hardware components used to implement the sensor. For example, a temperature sensor can include a thermistor, thermocouple, resistance temperature detector, integrated circuit temperature detector, or combinations thereof.

A sensor further can be described in terms of a function or functions the sensor performs within the system 900. For example, a sensor can be described as a security sensor when it is used to determine security events, such as unauthorized entry.

A sensor can be operated for different functions at different times. For example, system 900 can use data from a motion sensor to determine how to control lighting in the house when an authorized party is present and use the data as a factor to change a security system mode or state on the basis of unexpected movement when no authorized party is present. In another example, the system 900 can use the motion sensor data differently when a security system mode is in an "away" mode versus a "home" state, i.e., certain motion sensor data can be ignored while the system is in a "home" mode and acted upon when the system is in an "away" mode.

In some cases, a sensor can operate as multiple sensor types sequentially or concurrently, such as where a temperature sensor is used to detect a change in temperature, as well as the presence of a person or animal. A sensor also can operate in different modes (e.g., different sensitivity or threshold settings) at the same or different times. For example, a sensor can be configured to operate in one mode during the day and another mode at night. As another example, a sensor can operate in different modes based upon a mode or the disclosed security system, state of system 900, or as otherwise directed by the primary system processor.

Multiple sensors can be arranged in a single physical housing, such as where a single device includes movement, temperature, magnetic, and/or other sensors. Such a housing can also be referred to as a sensor, premises management device, or a sensor device. For clarity, sensors can be described with respect to the particular functions they perform and/or the particular physical hardware used.

Figure 10:
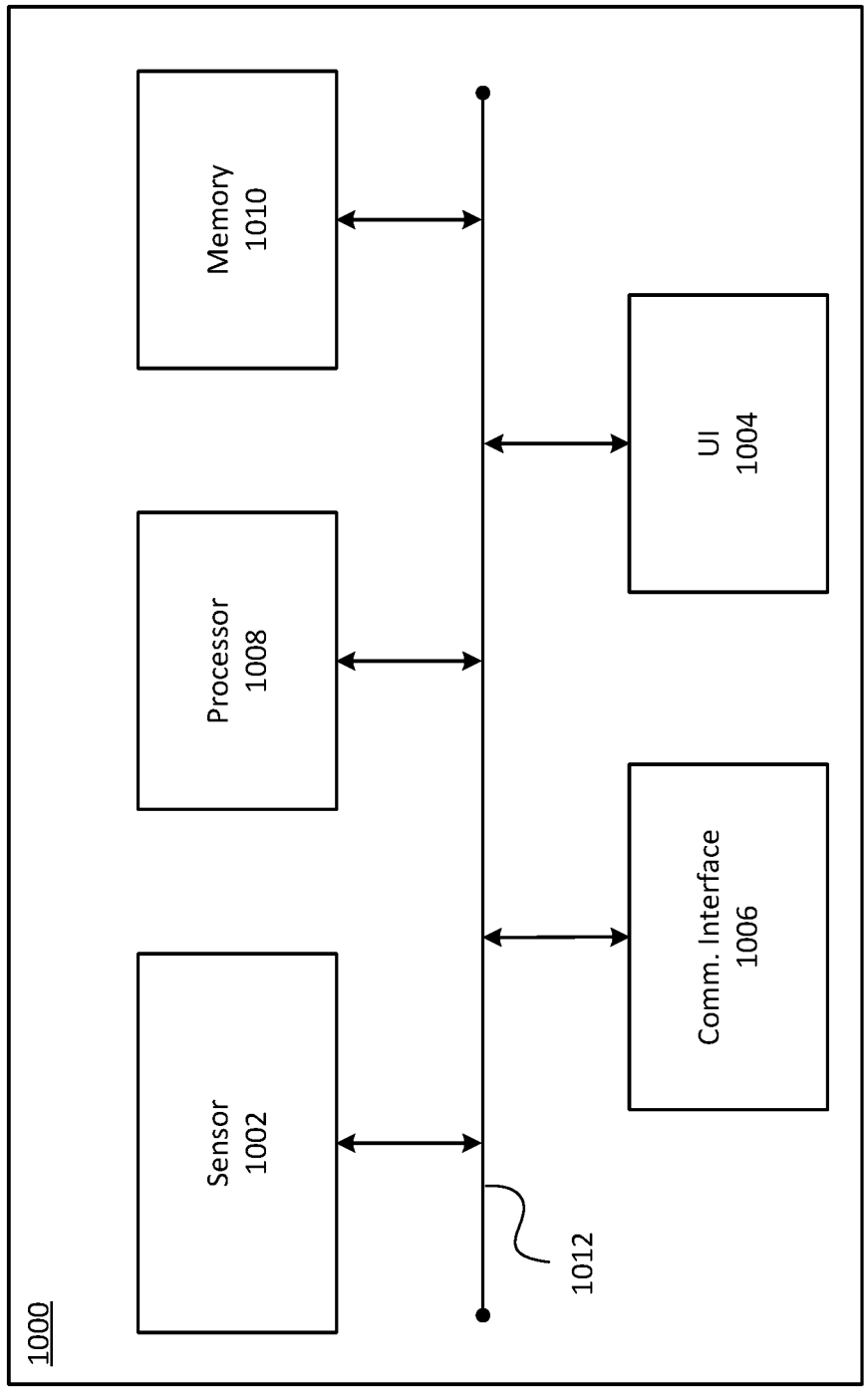
FIG. 10 is a block diagram of an example of a premises management device.

FIG. 10 is a block diagram of an example of an embodiment of a premises management device 1000. Premise management device 1000 can include a processor 1008, a memory 1010, a user interface (UI) 1004, a communications interface 1006, an internal bus 1012, and a sensor 1002. A person of ordinary skill in the art appreciates that various components of the premises management device 1000 described herein can include additional electrical circuit(s). Furthermore, it is appreciated that many of the various components listed above can be implemented on one or more integrated circuit (IC) chips. For example, in one embodiment, a set of components can be implemented in a single IC chip. In other embodiments, one or more of respective components can be fabricated or implemented on separate IC chips.

The sensor 1002 can be an environmental sensor, such as a temperature sensor, smoke sensor, carbon monoxide sensor, motion sensor, accelerometer, proximity sensor, passive infrared (PIR) sensor, magnetic field sensor, radio frequency (RF) sensor, light sensor, humidity sensor, pressure sensor, microphone, compass, or any other environmental sensor that obtains or provides a corresponding type of information about the environment in which the premises management device 1000 is located.

The processor 1008 can be a central processing unit (CPU) or other type of processor and can be communicably connected to the other components to receive and analyze data obtained by the sensor 1002, can transmit messages or packets that control operation of other components of the premises management device 1000 and/or external devices, and can process communications between the premises management device 1000 and other devices. The processor 1008 can execute instructions and/or computer executable components stored on the memory 1010. Such computer executable components can include, for example, a primary function component to control a primary function of the premises management device 1000 related to managing a premises, a communication component to locate and communicate with other compatible premises management devices, a computational component to process system related tasks, or any combination thereof.

The memory 1010 or another memory in the premises management device 1000 can also be communicably connected to receive and store environmental data obtained by the sensor 1002. A communication interface 1006 can function to transmit and receive data using a wireless protocol, such as a WiFi™, Thread®, or other wireless interface, Ethernet® or other local network interface, Bluetooth® or other radio interface, or the like and can facilitate transmission and receipt of data by the premises management device 1000 to and from other devices.

The user interface (UI) 1004 can provide information and/or receive input from a user of the system 900. The UI 1004 can include, for example, a speaker to output an audible sound when an event is detected by the premises management device 1000. Alternatively or additionally, the UI 1004 can include a light to be activated when an event is detected by the premises management device 1000. The UI 1004 can be relatively minimal, such as a liquid crystal display (LCD), light-emitting diode (LED) display, or limited-output display, or it can be a full-featured interface such as a touchscreen, keypad, or selection wheel with a click-button mechanism to enter input.

Internal components of the premises management device 1000 can transmit and receive data to and from one another via an internal bus 1012 or other mechanism. One or more components can be implemented in a single physical arrangement, such as where multiple components are implemented on a single integrated circuit. Premises management devices 1000 can include other components, and/or may not include all of the components illustrated.

The sensor 1002 can obtain data about the premises, and at least some of the data can be used to implement the security system. Through the bus 1012 and/or communication interface 1006, sensor data can be transmitted to or accessible by other components of the system 900. Generally, two or more sensors 1002 on one or more premises management devices 1000 can generate data that can be coordinated by the primary system processor to determine a system response and/or infer a state of the environment. In one example, the primary system processor of the system 900 can infer a state of intrusion based on data from entry detection sensors and motion sensors and, based on the determined state, further determine whether an unauthorized party is present and a location, within the premises, of the unauthorized party.

Figure 11:
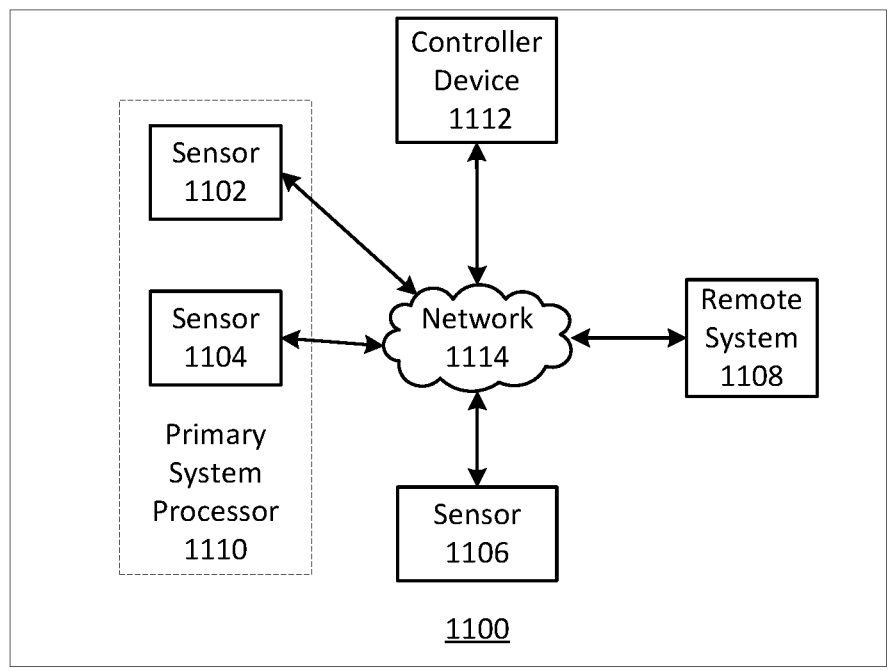
FIG. 11 is a block diagram of an example of a premises management system.

FIG. 11 is a block diagram of an example of an embodiment of a premises management system 1100. The premises management system 1100 can include security system features. System 1100 can be implemented over any suitable wired and/or wireless communication networks. One or more premises management devices, i.e., sensors 1102, 1104, 1106, and one or more controller devices 1112 can communicate via a local network 1114, such as a WiFi™ or other suitable network, with each other. The network 1114 can include a mesh-type network such as Thread®, which can provide network architecture and/or protocols for devices to communicate with one another. An authorized party can therefore interact with the premises management system 1100, for example, using the controller device 1112, which can communicate with the rest of the system 1100 via the network 1114.

The controller device 1112 and/or one or more of the sensors 1102, 1104, 1106, can be configured to implement a primary system processor 1110. The primary system processor 1110 can, for example, receive, aggregate, and/or analyze environmental information received from the sensors 1102, 1104, 1106, and the controller device 1112.

Furthermore, a portion or percentage of the primary system processor 1110 can be implemented in a remote system 1108, such as a cloud-based reporting and/or analysis system. The remote system 1108 can, for example, independently aggregate data from multiple locations, provide instruction, software updates, and/or aggregated data to a controller 1112, primary system processor 1110, and/or sensors 1102, 1104, 1106.

The sensors 1102, 1104, 1106, can be disposed locally to one another, such as within a single dwelling, office space, building, room, or the like, or they may be disposed remote from each other, such as at various locations around a wide perimeter of a premises. In some embodiments, sensors 1102, 1104, 1106, can communicate directly with one or more remote systems 1108. The remote system 1108 can, for example, aggregate data from multiple locations, provide instruction, software updates, and/or aggregated data to the primary system processor 1110, controller device 1112, and/or sensors 1102, 1104, 1106. Additionally, remote system 1108 can refer to a system or subsystem that is a part of a third party monitoring service or a law enforcement service.

The premises management system illustrated in FIG. 11 can be a part of a smart-home environment, which can include a structure, such as a house, office building, garage, mobile home, or the like. The devices of the smart home environment, such as the sensors 1102, 1104, 1106, and the network 1114 can be integrated into a smart-home environment that does not include an entire structure, such as a single unit in an apartment building, condominium building, or office building.

The smart home environment can control and/or be coupled to devices outside of the structure. For example, one or more of the sensors 1102, 1104 can be located outside the structure at one or more distances from the structure (e.g., sensors 1102, 1104 can be disposed outside the structure, at points along a land perimeter on which the structure is located, or the like. One or more of the devices in the smart home environment may not be physically within the structure. For example, the controller 1112, which can receive input from the sensors 1102, 1104, can be located outside of the structure.

The structure of the smart-home environment can include a plurality of rooms, separated at least partly from each other via walls. The walls can include interior walls or exterior walls. Each room can further include a floor and a ceiling. Devices of the smart-home environment, such as the sensors 1102, 1104, can be mounted on, integrated with, and/or supported by a wall, floor, or ceiling of the structure.

The controller device 1112 can be a general or special-purpose controller. For example, one type of controller device 1112 can be a general-purpose computing device running one or more applications that collect and analyze data from one or more sensors 1102, 1104, 1106 within the home. In this case, the controller device 1112 can be implemented using, for example, a mobile computing device such as a mobile phone, a tablet computer, a laptop computer, a personal data assistant, or wearable technology. Another example of a controller device 1112 can be a special-purpose controller that is dedicated to a subset of functions, such as a security controller that collects, analyzes and provides access to sensor data primarily or exclusively as it relates to various security considerations for a premises. The controller device 1112 can be located locally with respect to the sensors 1102, 1104, 1106 with which it can communicate and from which it can obtain sensor data, such as in the case where it is positioned within a home that includes a home automation and/or sensor network. Alternatively or additionally, controller device 1112 can be remote from the sensors 1102, 1104, 1106, such as where the controller device 1112 is implemented as a cloud-based system that can communicate with multiple sensors 1102, 1104, 1106, which can be located at multiple locations and can be local or remote with respect to one another.

Sensors 1102, 1104, 1106 can communicate with each other, the controller device 1112, and the primary system processor 1110 within a private, secure, local communication network that can be implemented wired or wirelessly, and/or a sensor-specific network through which sensors 1102, 1104, 1106 can communicate with one another and/or with dedicated other devices. Alternatively, as illustrated in FIG. 11, one or more sensors 1102, 1104, 1106 can communicate via a common local network 1114, such as a Wi-Fi™, Thread®, or other suitable network, with each other, and/or with the controller 1112 and primary system processor 1110. Alternatively or additionally, sensors 1102, 1104, 1106 can communicate directly with a remote system 1108.

The smart-home environment, including the sensor network shown in FIG. 11, can include a plurality of premises management devices, including intelligent, multi-sensing, network-connected devices that can integrate seamlessly with each other and/or with a central server or a cloud-computing system (e.g., controller 1112 and/or remote system 1108) to provide home-security and smart-home features. Such devices can include one or more intelligent, multi-sensing, network-connected thermostats (e.g., "smart thermostats"), one or more intelligent, network-connected, multi-sensing hazard detection units (e.g., "smart hazard detectors"), one or more intelligent, multi-sensing, network-connected entryway interface devices (e.g., "smart doorbells"), or any combination thereof. The smart hazard detectors, smart thermostats, and smart doorbells can be, for example, the sensors 1102, 1104, 1106 illustrated in FIG. 11. These premises management devices can be used by the security system, but can also have separate, primary functions.

For example, a smart thermostat can detect ambient climate characteristics (e.g., temperature and/or humidity) and can accordingly control a heating, ventilating, and air conditioning (HVAC) system of the structure. For example, the ambient climate characteristics can be detected by sensors 1102, 1104, 1106 illustrated in FIG. 11, and the controller 1112 can control the HVAC system (not illustrated) of the structure. However, unusual changes in temperature of a given room can also provide data that can supplement a determination of whether a situation is a security concern, for example, detecting a rapid drop in temperature in a given room due to a broken in window.

As another example, a smart hazard detector can detect the presence of a hazardous substance or a substance indicative of a hazardous substance (e.g., smoke, fire, or carbon monoxide). For example, smoke, fire, and/or carbon monoxide can be detected by sensors 1102, 1104, 1106 illustrated in FIG. 11, and the controller 1112 can control an alarm system to provide a visual and/or audible alarm to the user of the smart-home environment. However, the speaker of the hazard detector can also be used to announce security related messages.

As another example, a smart doorbell can control doorbell functionality, detect a person's approach to or departure from a location (e.g., an outer door to the structure), and announce a person's approach or departure from the structure via an audible and/or visual message that can be output by a speaker and/or a display coupled to, for example, the controller 1112. However, the detection of an approach of an unknown party can provide data to the security system to supplement determining whether the presence of the unknown party is a security concern.

A smart-home environment can include one or more intelligent, multi-sensing, network-connected entry detectors (e.g., "smart entry detectors") that can be specifically designed to function as part of a security subsystem. Such detectors can be or can include one or more of the sensors 1102, 1104, 1106 illustrated in FIG. 11. The smart entry detectors can be disposed at one or more windows, doors, and other entry points of the smart-home environment to detect when a window, door, or other entry point is opened, broken, breached, and/or compromised. The smart entry detectors can generate a corresponding signal to be provided to the controller 1112, primary system processor 1110, and/or the remote system 1108 when a window or door is opened, closed, breached, and/or compromised. In some embodiments of the security system, the alarm, which can be included with controller 1112 and/or coupled to the network 1114, may not arm unless all smart entry detectors (e.g., sensors 1102, 1104, 1106) indicate that all doors, windows, entryways, and the like are closed and/or that all smart entry detectors are armed.

The smart thermostats, the smart hazard detectors, the smart doorbells, the smart entry detectors, and other premise management devices of a smart-home environment (e.g., as illustrated as sensors 1102, 1104, 1106 of FIG. 11) can be communicatively connected to each other via the network 1114, and to the controller 1112, primary system processor 1110, and/or remote system 1108.

One or more users can control one or more of the network-connected smart devices in the smart-home environment using a network-connected computer or portable electronic device. In some examples, some or all of the users (e.g., individuals who live in the home) can register their mobile device, token and/or key fobs with the smart-home environment (e.g., with the controller 1112). Such registration can be made at a central server (e.g., the controller 1112 and/or the remote system 1108) to authenticate the user and/or the electronic device as being associated with the smart-home environment, and to provide permission to the user to use the electronic device to control the network-connected smart devices and the security system of the smart-home environment. A user can use their registered electronic device to remotely control the network-connected smart devices and security system of the smart-home environment, such as when the occupant is at work or on vacation. The user can also use their registered electronic device to control the network-connected smart devices when the user is located inside the smart-home environment.

As an alternative to or in addition to registering electronic devices, the smart-home environment can make inferences about which individuals live in the home and are therefore users and which electronic devices are associated with those individuals. As such, the smart-home environment can "learn" who is a user (e.g., an authorized user) and permit the electronic devices associated with those individuals to control the network-connected smart devices of the smart-home environment (e.g., devices communicatively coupled to the network 1114) including, in some embodiments, sensors used by or within the smart-home environment. Various types of notices and other information can be provided to users via messages sent to one or more user electronic devices. For example, the messages can be sent via e-mail, short message service (SMS), multimedia messaging service (MMS), unstructured supplementary service data (USSD), as well as any other type of messaging services and/or communication protocols.

Figure 12:
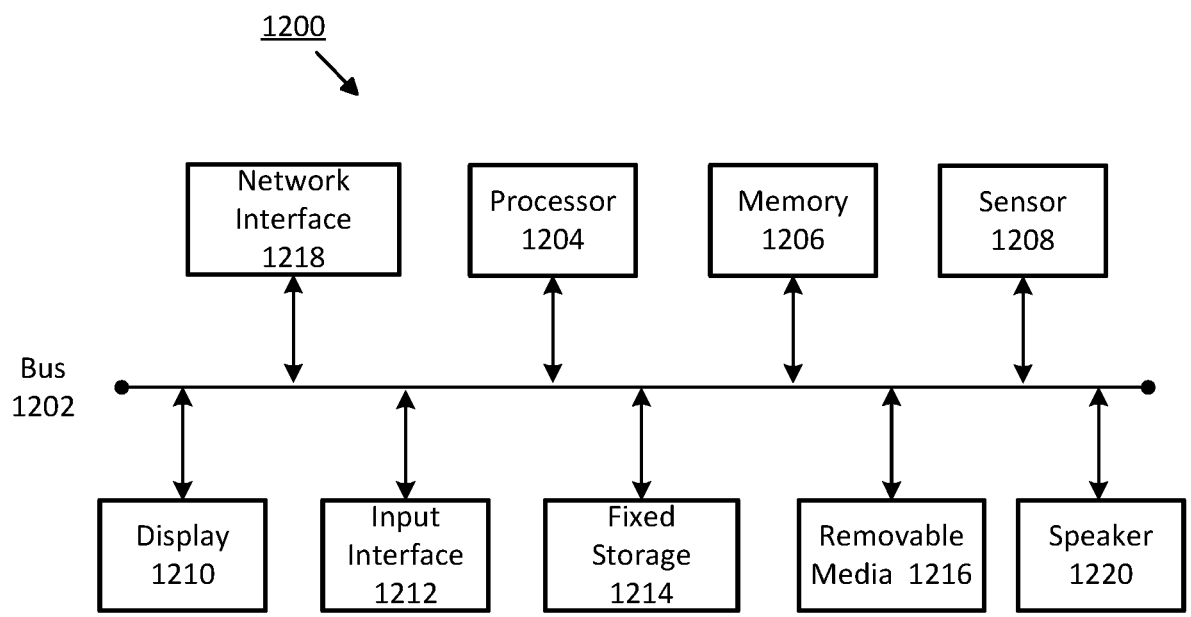
FIG. 12 is a block diagram of an example of a computing device suitable for implementing certain devices.

FIG. 12 is a block diagram of an example of a computing device 1200 suitable for implementing certain devices. The computing device 1200 can be used to implement, for example, the controller device 1112 or a premises management device including sensors as described above. The computing device 1200 can be constructed as a custom-designed device or can be, for example, a special-purpose desktop computer, laptop computer, or mobile computing device such as a smart phone, tablet, personal data assistant, wearable technology, or the like.

The computing device 1200 can include a bus 1202 that interconnects major components of the computing device 1200. Such components can include a central processor 1204; a memory 1206 (such as Random Access Memory (RAM), Read-Only Memory (ROM), flash RAM, or the like), a sensor 1208 (which can include one or more sensors), a display 1210 (such as a display screen), an input interface 1212 (which can include one or more input devices such as a keyboard, mouse, keypad, touch pad, turn-wheel, and the like), a fixed storage 1214 (such as a hard drive, flash storage, and the like), a removable media component 1216 (operable to control and receive a solid-state memory device, an optical disk, a flash drive, and the like), a network interface 1218 (operable to communicate with one or more remote devices via a suitable network connection), and a speaker 1220 (to output an audible communication). In some embodiments the input interface 1212 and the display 1210 can be combined, such as in the form of a touch screen.

The bus 1202 can allow data communication between the central processor 1204 and one or more memory components 1214, 1216, which can include RAM, ROM, or other memory. Applications resident with the computing device 1200 generally can be stored on and accessed via a computer readable storage medium.

The fixed storage 1214 can be integral with the computing device 1200 or can be separate and accessed through other interfaces. The network interface 1218 can provide a direct connection to the premises management system and/or a remote server via a wired or wireless connection. The network interface 1218 can provide such connection using any suitable technique and protocol, including digital cellular telephone, WiFi™, Thread®, Bluetooth®, near field communications (NFC), and the like. For example, the network interface 1218 can allow the computing device 1200 to communicate with other components of the premises management system or other computers via one or more local, wide-area, or other communication networks.

The foregoing description, for purpose of explanation, has been described with reference to specific configurations. However, the illustrative descriptions above are not intended to be exhaustive or to limit configurations of the disclosed technologies to the precise forms disclosed. Many modifications and variations are possible in view of the above teachings. The configurations were chosen and described in order to explain the principles of configurations of the disclosed technologies and their practical applications, to thereby enable others skilled in the art to utilize those configurations as well as various configurations with various modifications as may be suited to the particular use contemplated.

The invention claimed is:

1. Antenna switch diversity circuitry, comprising:
   a first switch connectable to a first transmitter, a first receiver, and a second receiver;

a second switch connectable to a second transmitter, a third receiver, and a fourth receiver;

a third switch directly connected to the first switch, the second switch, a first antenna, and a second antenna; and a fourth switch directly connected to the first switch, the second switch, a third antenna, and a fourth antenna.

2. The antenna switch diversity circuitry of claim 1, wherein:

the first switch is configured to be controlled by a first control signal;

the second switch is configured to be controlled by the first control signal;

the third switch is configured to be controlled by a second control signal; and the fourth switch is configured to be controlled by a third control signal.

3. The antenna switch diversity circuitry of claim 2, wherein the first control signal controls the first switch and the second switch in a manner so as to prevent a signal from the first transmitter and a signal from the second transmitter from being conveyed through a same switch.

4. The antenna switch diversity circuitry of claim 2, wherein the first control signal controls the first switch and the second switch in a manner so as to reduce a production of an intermodulation distortion signal by a signal from the first transmitter and a signal from the second transmitter.

5. The antenna switch diversity circuitry of claim 4, wherein:

the signal from the first transmitter has a first carrier frequency;

the signal from the second transmitter has a second carrier frequency; and the second carrier frequency is different from the first carrier frequency.

6. The antenna switch diversity circuitry of claim 1, wherein:

the first transmitter is for a first type of broadband cellular network technology; and the second transmitter is for a second type of broadband cellular network technology.

7. The antenna switch diversity circuitry of claim 6, wherein:

the first type of broadband cellular network technology complies with the International Mobile Telecommunications Advanced specification of the International Telecommunication Union; and the second type of broadband cellular network technology complies with the IMT-2020 standard of the International Telecommunication Union.

8. The antenna switch diversity circuitry of claim 1, wherein:

the first receiver is for a first type of broadband cellular network technology;

the second receiver is for the first type of broadband cellular network technology;

the third receiver is for a second type of broadband cellular network technology; and the fourth receiver is for the second type of broadband cellular network technology.

9. The antenna switch diversity circuitry of claim 8, wherein:

the first receiver is a primary receiver for the first type of broadband cellular network technology;

the second receiver is a diversity receiver for the first type of broadband cellular network technology;

the third receiver is a primary receiver for the second type of broadband cellular network technology; and the fourth receiver is a diversity receiver for the second type of broadband cellular network technology.

10. The antenna switch diversity circuitry of claim 8, wherein:

the first type of broadband cellular network technology complies with the International Mobile Telecommunications Advanced specification of the International Telecommunication Union; and the second type of broadband cellular network technology complies with the IMT-2020 standard of the International Telecommunication Union.

11. The antenna switch diversity circuitry of claim 1, wherein at least one of the first switch, the second switch, the third switch, or the fourth switch comprises a crossover switch.

12. The antenna switch diversity circuitry of claim 11, wherein:

the crossover switch comprises a double pole, double throw switch;

a first output associated with a first pole is connected to a second output associated with a second pole; and a second output associated with the first pole is connected to a first output associated with the second pole;

wherein the double pole, double throw switch is configured to be controlled so that:

in a first position:

the first pole is connected to the first output associated with the first port; and the second pole is connected to the first output associated with the second port; and in a second position:

the first pole is connected to the second output associated with the first pole; and the second pole is connected to the second output associated with the second pole.

13. The antenna switch diversity circuitry of claim 11, wherein the crossover switch comprises:

a first electronic switch connected between a first input port and a first output port;

a second electronic switch connected between the first input port and a second output port;

a third electronic switch connected between a second input port and the first output port; and a fourth electronic switch connected between the second input port and the second output port.

14. The antenna switch diversity circuitry of claim 13, wherein at least one of the first electronic switch, the second electronic switch, the third electronic switch, or the fourth electronic switch comprises a complementary metal-oxide-semiconductor field-effect transistor switch.

15. The antenna switch diversity circuitry of claim 14, wherein the crossover switch further comprises an inverter configured to cause:

both an n-channel metal-oxide-semiconductor field-effect transistor of the complementary metal-oxide-semiconductor field-effect transistor switch and a p-channel metal-oxide-semiconductor field-effect transistor of the complementary metal-oxide-semiconductor field-effect transistor switch to be one of concurrently on or concurrently off;

both the first electronic switch and the fourth electronic switch to be on concurrently with both the second electronic switch and the third electronic switch being off; and both the second electronic switch and the third electronic switch to be on concurrently with both the first electronic switch and the fourth electronic switch being off.

16. The antenna switch diversity circuitry of claim 1, wherein the antenna switch diversity circuitry is disposed in a mobile communications device.

17. The antenna switch diversity circuitry of claim 16, wherein:
the first antenna is disposed near a first corner of a housing of the mobile communications device;
the second antenna is disposed near a second corner of the housing;
the third antenna is disposed near a third corner of the housing; and
the fourth antenna is disposed near a fourth corner of the housing.

18. The antenna switch diversity circuitry of claim 1, wherein at least one of:
the first switch is connectable to the first transmitter, the first receiver, and the second receiver, or
the second switch is connectable to the second transmitter, the third receiver, and the fourth receiver
via at least one of a direct connection, a switch, or a duplexer.

19. Antenna switch diversity circuitry, comprising:
a first switch connectable to a first transmitter, a first receiver, and a second receiver, the first switch configured to be controlled by a first signal;
a second switch connectable to a second transmitter, a third receiver, and a fourth receiver, the second switch configured to be controlled by the first signal;
a third switch directly connected to the first switch, the second switch, a first antenna, and a second antenna, the third switch configured to be controlled by a second signal;
a fourth switch directly connected to the first switch, the second switch, a third antenna, and a fourth antenna, the fourth switch configured to be controlled by a third signal; and
a fifth switch directly connected to the first switch, the second switch, a fifth antenna, and a sixth antenna, the fifth switch configured to be controlled by a fourth signal.

20. The antenna switch diversity circuitry of claim 19, wherein the third switch is further directly connected to a seventh antenna.

21. A method for preventing a signal from a first transmitter and a signal from a second transmitter from being conveyed through a same switch, comprising:
having the first transmitter connected to a first switch;
having the second transmitter connected to a second switch;
having the first switch connected to a third switch and to a fourth switch;
having the second switch connected to the third switch and to the fourth switch; and
controlling the first switch and the second switch in a manner so as to prevent the signal from the first transmitter and the signal from the second transmitter from being conveyed through the same switch, the same switch being the third switch or the fourth switch.

* * * * *